United States Patent [19]

Levinson

[11] Patent Number: 4,983,978
[45] Date of Patent: Jan. 8, 1991

[54] MULTI-FREQUENCY COMB GENERATOR FOR RADAR AND THE LIKE

[75] Inventor: Samuel Levinson, Briarcliff Manor, N.Y.

[73] Assignee: United Technologies Corporation, Hartford, Conn.

[21] Appl. No.: 326,585

[22] Filed: Mar. 21, 1989

[51] Int. Cl.$^5$ .............................................. G01S 13/40
[52] U.S. Cl. ...................... 342/200; 331/18; 307/523; 342/129; 342/199
[58] Field of Search ............... 342/129, 175, 192, 193, 342/199; 331/10, 18, 23, 25; 455/112; 307/522, 523

[56] References Cited

U.S. PATENT DOCUMENTS

| | | | |
|---|---|---|---|
| 3,885,240 | 5/1975 | Jensen | 342/106 |
| 3,894,219 | 7/1975 | Weigel | 342/159 X |
| 3,894,293 | 7/1975 | Jensen | 342/91 |
| 3,902,174 | 8/1975 | Siegel | 342/110 |
| 3,905,034 | 9/1975 | Jensen et al. | 342/110 |
| 3,928,851 | 12/1975 | Jensen | 342/111 |
| 4,158,842 | 6/1979 | Clemens et al. | 342/16 |
| 4,214,316 | 7/1980 | Lipsky | 455/141 |
| 4,322,692 | 3/1982 | Brewerton et al. | 331/25 X |
| 4,652,879 | 3/1987 | Rudish et al. | 342/371 |
| 4,797,637 | 1/1989 | Kesaga et al. | 331/25 X |
| 4,800,341 | 1/1989 | Johnson | 331/25 X |
| 4,851,787 | 7/1989 | Martin | 331/25 X |
| 4,871,981 | 10/1989 | Franklin | 331/25 X |
| 4,871,984 | 10/1989 | Laton et al. | 307/522 X |
| 4,885,553 | 12/1989 | Hietala et al. | 331/25 X |

Primary Examiner—Thomas H. Tarcza
Assistant Examiner—John B. Sotomayor

[57] ABSTRACT

A multi-frequency comb generator (2-4; FIG. 1) for radar and the like using a feedback loop through a frequency multiplier, such as for example, a doubler (3). A reference or master oscillator output goes through a directional coupler (2), for example, a ten dB coupler with twenty dB directivity, to the frequency doubler and then an amplifier (4). The amplifier output is superposed on the reference oscillator output (1) and is applied to the input of the doubler. Frequency doublers, when driven by multiple frequencies, cross modulate and generate sum and difference frequencies, which in going around the loop are fed back to the input, resulting in a comb of frequencies (5). As part of the frequency selecting section of a radar exciter (FIG. 2) the comb of frequencies and the output of a parallel frequency multiplier (8) are fed to a mixer (7), and the mixer's output, along with the coupled output ("N×f"; 6) from the parallel frequency multiplier (8) is filtered & switched in a switched filter bank (9) and then amplified (10). The final output (11) is a signal including "[N±(1, 2, 3, 4...)]×f" and "N×f", where the frequency of the final signal output is selected by the switched filter bank.

23 Claims, 1 Drawing Sheet

MULTI-FREQUENCY COMB GENERATOR FOR RADAR AND THE LIKE

TECHNICAL FIELD

This invention relates to multi-frequency signal generators used in, for example, radar systems and the like, and more particular to such a generator in which a comb of frequencies are generated and one or more components are selected by filtering and switching to generate the frequency of the output signal.

BACKGROUND ART

In the electronic arts, particularly, for example, in coherent or Doppler radar systems, there is a need for multi-frequency signals, that is, a "comb of frequencies," which are co-existent in time and locked to a single reference frequency. Such a comb of frequencies includes integer multiples of the reference frequency, that is, 1, 2, 3, 4,..., etc., multiples of the reference frequency.

In the past, step recovery diodes have been used in such multi-frequency signal generators. However, such step recovery diodes cause very substantial phase jitter, that is, frequency modulated (FM) noise, on the frequency comb components. Such jitter is considered highly undesirable.

DISCLOSURE OF INVENTION

The primary objective of the present invention thus is to provide a quiet, multiple frequency source, which avoids the use of step recovery diodes and hence their noise and substantial phase jitter.

The present invention achieves this objective by using a feedback loop comprising an amplified frequency multiplier subsystem, including, for example, a doubler and an amplifier.

In the invention a reference or master oscillator's signal with a frequency "f" is fed to a directional coupler, which superimposes the amplified frequency multiplier's feedback signal onto the output of the reference oscillator's signal, producing a comb of frequencies of "f+2f+3f+4f...", etc. In this way no step recovery diodes are necessary.

Additionally, the invention provides a lower cost approach with simplicity, as well as the noted performance advantages, particularly producing output frequency components having low noise, including both low phase noise and low amplitude noise.

Although particularly applicable to radar systems, other exemplary applications include communications systems, sonar systems, music synthesizers, etc.

In a radar system, particularly the frequency selecting section of a radar exciter subsystem, the comb of frequencies and the output of a frequency multiplier, having the same frequency "f" input as the comb generator, are mixed and combined with the "N×f" component from the multiplier. The resultant comb of frequencies with components of "[N+(1, 2, 3, 4,...)]×f" and "N×f" are then fed to a switch filter bank. The switch filter bank selects the desired component of the comb of frequencies. The selected signal component from the filter bank is then amplified producing the desired output.

The foregoing and other features and advantages of the present invention will become more apparent from the following further description and its related drawing.

BEST MODE FOR CARRYING OUT THE INVENTION

Figure 1:
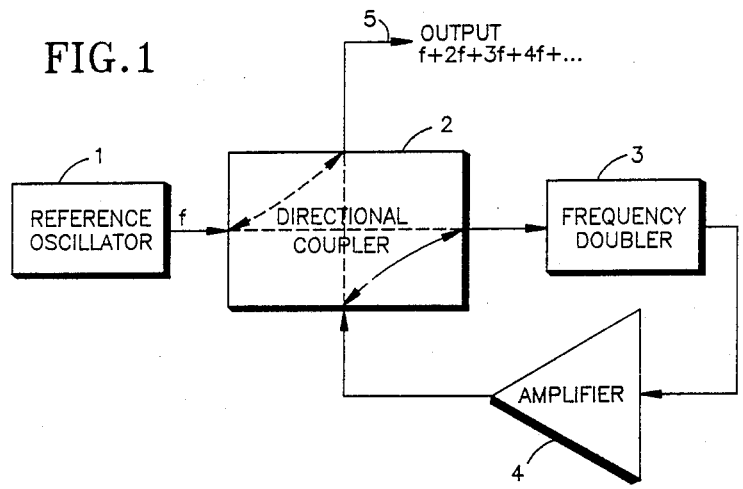
FIG. 1 is a simplified, block diagram of an exemplary multi-frequency comb generating system of the present invention.

With reference to the block diagram of FIG. 1, the exemplary system of the present invention includes a reference oscillator 1 producing a signal with a frequency output "f" feeding into a directional coupler 2. The oscillator 1 is preferably a precise frequency, low noise one, such as for example, an ovenized quartz crystal oscillator, and the coupler 2 typically can be, for example, a ten (10) dB coupler with twenty (20) dB directivity.

The directional coupler 2 in turn feeds the signal "f" into a frequency doubler 3 and through an amplifier 4, which amplified doubled frequency signal is fed back to the directional coupler 2 in a feedback loop.

Thus, the reference oscillator's output "f" goes through the directional coupler 2 to the frequency doubler 3. The output of the frequency doubler 3 then goes to the amplifier 4. The gain of the amplifier preferably is about equal to the total of the loss of the coupler 2 and the conversion loss of the frequency doubler 3, but is not large enough to cause oscillation, that is, it is less than that which would cause oscillation.

The output of the amplifier 4 at "2f" is then superposed on the output "f" of the reference oscillator 1, and is applied back to the input of the doubler 3 in a continuous feedback loop.

Frequency doublers, when driven by multiple frequencies, cross modulate and generate sum and difference frequencies, which, in going around the feedback loop, are fed back to the input.

The result is a comb of frequencies: f, 2f, 3f, 4f,..., etc., at the combined output 5, with the components being approximately equal in magnitude.

Depending on the application involved, only some of the components of the comb may be needed. For example, in an exemplary radar exciter subsystem, only the first four frequency components are used.

As noted, the frequency multiplier 3 is a doubler. However, other multiplier ratios, for example, a tripler, may also be useful. However, it is noted that doublers are commonly available, while triplers generally are not.

Figure 2:
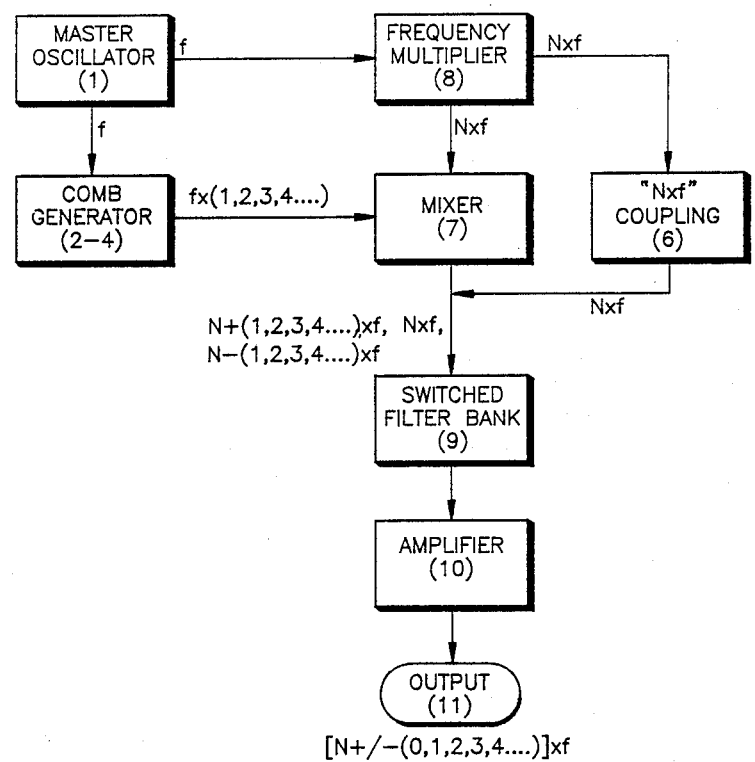
FIG. 2 is a simplified, functional block diagram of a frequency selecting section of an exemplary radar exciter or frequency synthesizer subsystem of an exemplary coherent radar system, in which the comb generating system of FIG. 1 can be used.

The comb generator of FIG. 1 was developed for and preferably is used in a radar system, such as, for example, in the frequency selecting section of a coherent radar frequency synthesizer or radar exciter subsystem, which section is shown in FIG. 2. As is known and can be generally seen in FIG. 2, the comb generator 2-4 of FIG. 1 receives a signal having a frequency "f" from the reference or master oscillator 1. It then outputs a comb of frequencies "f×(1, 2, 3, 4....)", namely a signal having all of the comb frequencies components and sends it to the mixer 7. Typically, the comb will include frequencies "1f+2f+3f+4f" for the exemplary frequency selecting section of the radar exciter subsystem.

The reference or master oscillator also sends a signal of frequency "f" to a frequency multiplier 8, which is in parallel with the comb generator 2-4 and in turn outputs a signal of "N×f" to the mixer 7. "N" is a number typically in the range of ten to thirty (10-30).

The mixer circuitry of the mixer 7 is set to provide feed through of the component "N×f" to be substantially equal in magnitude to the components resulting from mixing the comb output with "N×f". The mixer circuitry to couple in the "N×f" component can be simply a resistor, or a "N×f" coupler 6, or any convenient or economical means. The mixer output spectrum out of the frequency multiplier 8 is a series of frequencies, "N−(1, 2, 3, 4...)×f", "N×f" and "N+(1, 2, 3, 4....)×f", which are substantially equal in amplitude.

The mixed signals are then sent to the switch filter bank 9, with the filtered signal then amplified in block 10. The final filtered, switched and amplified signal is provided at the output 11, as the signal "[N±(0, 1, 2, 3, 4....)]×f", with the output signal being "[N−4]×f, [N−3]×f, ...., N×f,....(N+4)×f,...." as selected by the switched filter bank 9.

It is noted that the number of output frequencies is one "(N×f)" plus twice the number of usable comb generator output components. Each comb generator component in the mixer 7 generates "[N+(1, 2, 3, 4....)]×f" and "[N−(1, 2, 3, 4....)]×f" (the sum and/or difference components).

Although this invention has been shown and described with respect to detailed, exemplary embodiment(s) thereof, it should be understood by those skilled in the art that various changes in form, detail, methodology and/or approach may be made without departing from the spirit and scope of this invention.

Having thus described at least one exemplary embodiment of the invention, that which is new and desired to be secured by Letters Patent is claimed below.

1. A multi-frequency signal generator system producing a signal which is a comb of frequencies, comprising:
   a reference oscillator having a signal output and producing a signal with a frequency "f";
   a directional coupler having a first input connected to the output of said reference oscillator, said coupler having a first and a second output and a second, feedback input;
   a frequency multiplier connected to said first output and having an output of its own; and
   an amplifier connected to the output of said multiplier and having an output of its own, the amplifier output being connected to said feedback input of said directional coupler; said reference signal "f" being fed from said reference oscillator
   through said directional coupler and
   through said frequency multiplier and said amplifier and then fed back to said directional coupler, and
   then back again through said multiplier and said amplifier and back to said directional coupler, producing at said second output of said directional coupler an output signal having a comb of frequencies including at least f+2f+3f.

2. The multi-frequency signal generator system of claim 1, wherein said frequency multiplier is a doubler.

3. The multi-frequency signal generator system of claim 1, wherein there is further included: amplifier means making the gain of the amplifier substantially equal to the total of the gain loss to the signal produced by said coupler and the conversion loss to the signal caused by said frequency doubler but less than that which would cause oscillation, resulting in the frequency components of the output signal being substantially equal in magnitude.

4. The multi-frequency signal generator system of claim 1, wherein there is further included:
   oscillator means causing the signal output of said reference oscillator to have low noise at said output.

5. The multi-frequency signal generator system of claim 1, wherein there is further included:
   means causing said comb of frequencies also to include at least 4f.

6. The multi-frequency signal generator system of claim 1, wherein there is further included:
   means causing said output frequency components to have low noise, including both low phase noise and low amplitude noise.

7. The multi-frequency signal generator system of claim 1, wherein there is further included:
   a radar system associated with the signal generator, said radar system having a coherent radar exciter having a frequency selecting section, said output signal having said comb of frequencies being used in said radar system as part of the frequency selecting section of the radar exciter of the system.

8. A multi-frequency signal generator system producing a signal which is a comb of frequencies, comprising:
   a reference oscillator having a signal output and producing a signal with a frequency "f";
   a directional coupler having a first input connected to the output of said reference oscillator, said coupler having a first and a second output and a second, feedback input;
   a frequency multiplier connected to said first output and having an output of its own; and
   an amplifier connected to the output of said multiplier and having an output of its own, the amplifier output being connected to said feedback input of said directional coupler; said reference signal "f" being fed from said reference oscillator
   through said directional coupler and
   through said frequency multiplier and said amplifier and then fed back to said directional coupler, and
   then back again through said multiplier and said amplifier and back to said directional coupler, producing at said second output of said directional coupler an output signal having a comb of frequencies including at least f+2+f+3f; there being further included
   a radar system associated with the signal generator, said radar system having a coherent radar exciter having a frequency selecting section, said output signal having said comb of frequencies being used in said radar system as part of the frequency selecting section of the radar exciter of the system; and
   a switch filter bank connected to said second output, the components of the signal output being selected by said switch filter bank filtering and switching the output signal having said comb of frequencies of said second output.

9. The multi-frequency signal generator system of claim 8, wherein there is further included:
   a frequency multiplier; and
   a mixer; said mixer mixing together the output signals from said frequency multiplier and said comb generator.

10. A method of generating a multi-frequency signal having a comb of frequencies producing a comb generator, comprising the following step(s):
   (a) providing a multi-frequency signal generator system, including
      a reference oscillator having a signal output and producing a signal at said output with a frequency "f";
      a directional coupler having a first input connected to the output of said reference oscillator, said coupler having a first and a second output and a second, feedback input;
      a frequency multiplier connected to said first output and having an output of its own; and
      an amplifier connected to the output of said multiplier and having an output of its own, the amplifier output being connected to said feedback input of said directional coupler; and
   (b) feeding said reference signal "f" from said reference oscillator through said directional coupler and through said frequency multiplier and said amplifier and then feeding the amplified frequency multiplied signal back to said directional coupler, and
   (c) then feeding said amplified frequency multiplied signal back again through said multiplier and said amplifier and back to said directional coupler additional times, producing at said second output of said directional coupler an output signal having a comb of frequencies including at least f+2f+3f.

11. The method of claim 10, wherein there is included the following step(s):
   providing said frequency multiplier in the form of a doubler; and wherein there is further included the step of:
   allowing said doubler to cross modulate and generate sum and difference frequencies.

12. The method of claim 10, wherein there is included the step of:
   setting the gain of the amplifier to be substantially equal to the total of the gain loss to the signal produced by said coupler and the conversion loss to the signal caused by said frequency doubler but less than that which would cause oscillation, resulting in the frequency components of the output signal being substantially equal in magnitude.

13. The method of claim 10, wherein there is further included the steps of:
   providing said multi-frequency signal generator with its comb of frequencies as part of a frequency selecting section of a radar exciter of a radar system and feeding the output of the comb generator to a switched filter bank, selecting a particular frequency component of the comb of frequencies.

14. A method of generating a multi-frequency signal having a comb of frequencies producing a comb generator, comprising the following step(s):
   (a) providing a multi-frequency signal generator system, including
      a reference oscillator having a signal output and producing a signal at said output with a frequency "f";
      a directional coupler having a first input connected to the output of said reference oscillator, said coupler having a first and a second output and a second, feedback input;
      a frequency multiplier connected to said first output and having an output of its own; and
      an amplifier connected to the output of said multiplier and having an output of its own, the amplifier output being connected to said feedback input of said directional coupler; and
   (b) feeding said reference signal "f" from said reference oscillator through said directional coupler and through said frequency multiplier and said amplifier and then feeding the amplified frequency multiplied signal back to said directional coupler, and
   (c) then feeding said amplified frequency multiplied signal back again through said multiplier and said amplifier and back to said directional coupler additional times, producing at said second output of said directional coupler an output signal having a comb of frequencies including at least f+2f+3f;
   there being further included the steps of
   providing said multi-frequency signal generator with its comb of frequencies as part of a frequency selecting section of a radar exciter of a radar system and feeding the output of the comb generator to a switched filter bank, selecting a particular frequency component of the comb of frequencies; and
   providing a frequency multiplier having an input signal with a frequency "f" in parallel with the switched filter bank and mixing the output signals from the frequency multiplier and the comb generator.

15. The method of claim 14, wherein there is further included the step(s) of:
   filtering and amplifying the mixed output signals from said frequency multiplier and the comb generator.

16. The multi-frequency signal generator system of claim 8, wherein said frequency multiplier is a doubler.

17. The multi-frequency signal generator system of claim 8, wherein there is further included:
   amplifier means making the gain of the amplifier substantially equal to the total of the gain loss to the signal produced by said coupler and the conversion loss to the signal caused by said frequency doubler but less than that which would cause oscillation, resulting in the frequency components of the output signal being substantially equal in magnitude.

18. The multi-frequency signal generator system of claim 8, wherein there is further included:
   oscillator means causing the signal output of said reference oscillator to have low noise at said output.

19. The multi-frequency signal generator system of claim 8, wherein there is further included:
   4f means causing said comb of frequencies also to include at least 4f.

20. The multi-frequency signal generator system of claim 8, wherein there is further included:
   low noise means causing said output frequency components to have low noise, including both low phase noise and low amplitude noise.

21. The method of claim 4, wherein there is included the step of:

setting the gain of the amplifier to be substantially equal to the total of the gain loss to the signal produced by said coupler and the conversion loss to the signal caused by said frequency doubler but less than that which would cause oscillation, resulting in the frequency components of the output signal being substantially equal in magnitude.

22. The method of claim 14, wherein there is further included the steps of:

providing said multi-frequency signal generator with its comb of frequencies as part of a frequency selecting section of a radar exciter of a radar system and feeding the output of the comb generator to a switched filter bank, selecting a particular frequency component of the comb of frequencies.

23. The method of claim 14, wherein there is further included the steps of:

providing said multi-frequency signal generator with its comb of frequencies as part of a frequency selecting section of a radar exciter of a radar system and feeding the output of the comb generator to a switched filter bank, selecting a particular frequency component of the comb of frequencies.

* * * * *

UNITED STATES PATENT AND TRADEMARK OFFICE
CERTIFICATE OF CORRECTION

PATENT NO. : 4,983,978
DATED : January 8, 1991
INVENTOR(S) : Samuel Levinson

It is certified that error appears in the above-identified patent and that said Letters Patent is hereby corrected as shown below:

Col. 1, line 61, after "N", "+" should be --$\pm$--.

Col. 2, line 20, after "oscillator", "I" should be --1--.

Col. 3, line 11, after "output" insert --5--.

Col. 6, line 67, after "claim", "4" should be --14--.

Signed and Sealed this

Twenty-fourth Day of November, 1992

Attest:

DOUGLAS B. COMER

*Attesting Officer*     *Acting Commissioner of Patents and Trademarks*